(12) United States Patent
Ebihara et al.

(10) Patent No.: US 10,750,111 B2
(45) Date of Patent: Aug. 18, 2020

(54) CMOS IMAGE SENSOR WITH DIVIDED BIT LINES

(71) Applicant: OmniVision Technologies, Inc., Santa Clara, CA (US)

(72) Inventors: Hiroaki Ebihara, San Jose, CA (US); Rui Wang, San Jose, CA (US); Zheng Yang, San Jose, CA (US); Eiichi Funatsu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 29 days.

(21) Appl. No.: 16/222,832

(22) Filed: Dec. 17, 2018

(65) Prior Publication Data

US 2019/0268556 A1    Aug. 29, 2019

Related U.S. Application Data

(60) Provisional application No. 62/634,762, filed on Feb. 23, 2018.

(51) Int. Cl.
*H04N 5/378* (2011.01)
*H01L 27/146* (2006.01)
*H04N 5/374* (2011.01)

(52) U.S. Cl.
CPC ....... *H04N 5/378* (2013.01); *H01L 27/14634* (2013.01); *H01L 27/14636* (2013.01); *H01L 27/14643* (2013.01); *H04N 5/374* (2013.01)

(58) Field of Classification Search
CPC ........ H04N 5/378; H04N 5/374; H04N 5/357; H04N 5/3765; H01L 27/14634; H01L 27/14636; H01L 27/14643; H03M 1/18; H03M 1/56

See application file for complete search history.

(56) References Cited

U.S. PATENT DOCUMENTS

| 9,007,504 | B2 | 4/2015 | Manabe et al. |
| 9,609,213 | B2 | 3/2017 | Wakabayashi |
| 2010/0277623 | A1* | 11/2010 | Tejada ............... H04N 5/35554 348/241 |

(Continued)

OTHER PUBLICATIONS

ROC (Taiwan) Patent Application No. 108105720—Office Action and Search Report, dated Jun. 5, 2020, 6 pages.

*Primary Examiner* — Lin Ye
*Assistant Examiner* — Tuan H Le
(74) *Attorney, Agent, or Firm* — Christensen O'Connor Johnson Kindness PLLC

(57) ABSTRACT

An image sensor includes a pixel array including a plurality of pixels. A bit line coupled to a column of pixels is separated in to a plurality of electrically portions that are coupled to corresponding portions of rows of the pixel array. A first switching circuit of a readout circuit is coupled to the bit line. A first switching circuit is configured to couple a bit line current source to the bit line to provide a DC current coupled to flow through the bit line and through the first switching circuit during a readout operation of a pixel coupled to the bit line. A second switching circuit is configured to couple and ADC to the bit line during the readout operation of the pixel. Substantially none of the DC current provided by the bit line current source flows through the second switching circuit during the readout operation of the pixel.

21 Claims, 15 Drawing Sheets

(56) References Cited

U.S. PATENT DOCUMENTS

| | | | |
|---|---|---|---|
| 2016/0118971 A1* | 4/2016 | Sugiyama | H03K 5/249 |
| | | | 345/691 |
| 2017/0085820 A1* | 3/2017 | Inada | H03M 1/08 |
| 2018/0124345 A1* | 5/2018 | Aoki | H04N 5/374 |
| 2019/0051680 A1* | 2/2019 | Hanzawa | H04N 5/35527 |

* cited by examiner

CMOS IMAGE SENSOR WITH DIVIDED BIT LINES

CROSS REFERENCE TO RELATED APPLICATION

The application claims the benefit of U.S. Provisional Application No. 62/634,762, filed Feb. 23, 2018, the contents of which are incorporated herein by reference.

BACKGROUND INFORMATION

Field of the Disclosure

This disclosure relates generally to bit lines, and in particular but not exclusively, relates to bit lines for use with image sensors.

Background

Image sensors have become ubiquitous. They are widely used in digital still cameras, cellular phones, security cameras, as well as, medical, automobile, and other applications. The technology used to manufacture image sensors, and in particular, complementary metal-oxide-semiconductor (CMOS) image sensors (CIS), has continued to advance at a great pace. For example, the demands for higher resolution and lower power consumption have encouraged the further miniaturization and integration of these image sensors.

The pixels included in image sensors include photodiodes that generate image charge in response to light that is incident upon the image sensor. The image charge is transferred from the photodiodes through transfer transistors to floating diffusions in order to capture image data. The image data in the floating diffusions is amplified and read out through bit lines in order to read out the image data from the image sensor. The frame rate for reading out images from in an image sensor is limited by the bit line settling time.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
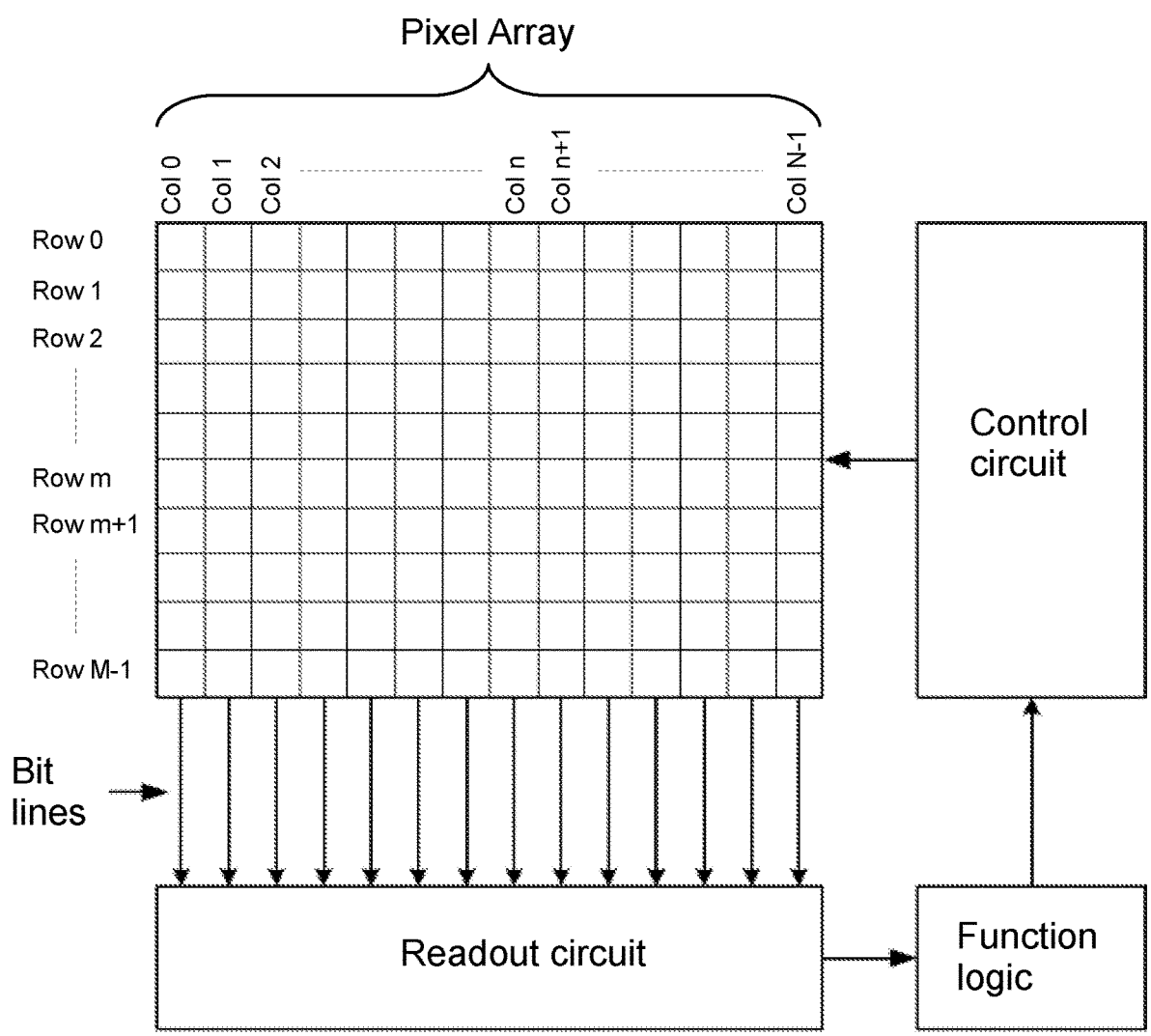
FIG. 1 illustrates one example of an imaging system in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Methods and apparatuses for dividing bit lines in an imaging circuit are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

The frame rate of image sensor is limited by the bit line settling time. Bit line settling time can be shortened by reducing bit line capacitance. As will be discussed, in various examples, the bit lines are divided into separate portions that are electrically isolated from one another in examples in accordance with the teachings of the present disclosure. By dividing bit lines into separate portions, the capacitance on each divided bit line is reduced. As will be shown, in one example, column bit lines are divided or segmented into separate portions near the middle to form a "top" bit line portion and a "bottom" bit line portion for each column, which are coupled to single readout circuit through hybrid bonds between wafers. In this way, the lengths of the separate bit line segments are shorter, and the capacitance on each separate bit line portion can therefore be reduced so that bit line settling time can be reduced. As a result, the frame rate of the CMOS image sensor (CIS) is improved in accordance with the teachings of the present invention.

To illustrate, FIG. 1 illustrates one example of an imaging system in accordance with an embodiment of the present disclosure. Imaging system includes pixel array, control circuit, readout circuit, and function logic. In one example, pixel array is a two-dimensional (2D) array of photodiodes, or image sensor pixels. As illustrated, photodiodes are arranged into rows (e.g., rows Row 0 to Row M−1) and columns (e.g., column Col 0 to Col N−1) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array has acquired its image charge through photo-generation of the image charge, corresponding image data is readout by a readout circuit and then transferred to function logic. Readout circuit may be coupled to readout image data from the plurality of photodiodes in pixel array. In various examples, the readout circuit may include amplification circuit, analog-to-digital (ADC) conversion circuit, or otherwise. In one example, the readout circuit may read out a row of image data at a time along bit lines as illustrated in FIG. 1. The function logic may store the image data or even manipulate the image data by applying post image effects (e.g., crop, rotate, remove red eye, adjust brightness, adjust contrast, or otherwise).

Figure 2:
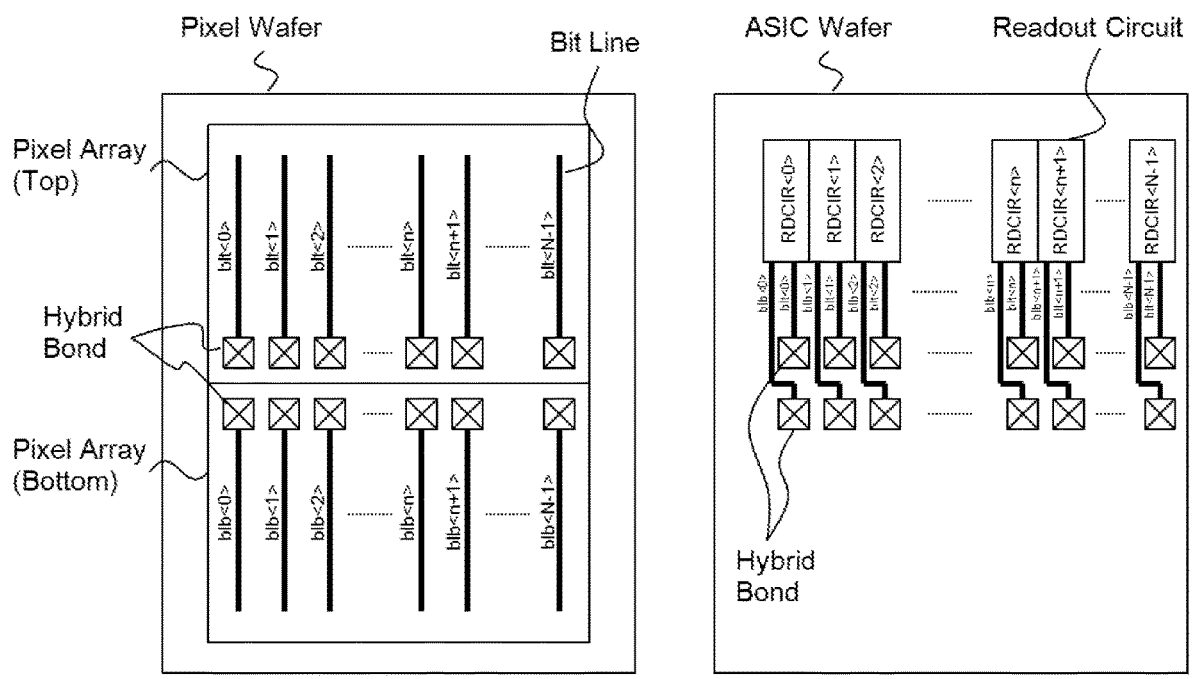
FIG. 2 shows an example of stacked sensors implemented with a pixel wafer and an ASIC wafer in accordance with an embodiment of the present disclosure.

FIG. 2 shows an example of stacked sensors implemented with a pixel wafer and an application specific integrated circuit (ASIC) wafer in accordance with an embodiment of the present disclosure. In one example, the pixel wafer includes a pixel array and bit lines, and the ASIC wafer includes a readout circuit coupled to read out signals from the pixel array. In the example the bit lines pass signals from the pixel array to the ASIC wafer. Instead of one bit line in each readout column, examples in accordance with the teachings of the present invention include a bit line for each column which is segmented or divided near the middle into two divided bit lines that are electrically isolated from one another: a top bit line (e.g., blt<0>, blt<N−1>) and a bottom bit line (e.g., blb<0>, blb<1>, blb<N−1>). In one example, each divided bit line in the pixel wafer is coupled to its own designated readout circuit (e.g., RDCIR<0>, RDCIR<N−1>) in the ASIC wafer interconnected to the pixel wafer through hybrid bonds.

Figure 3:
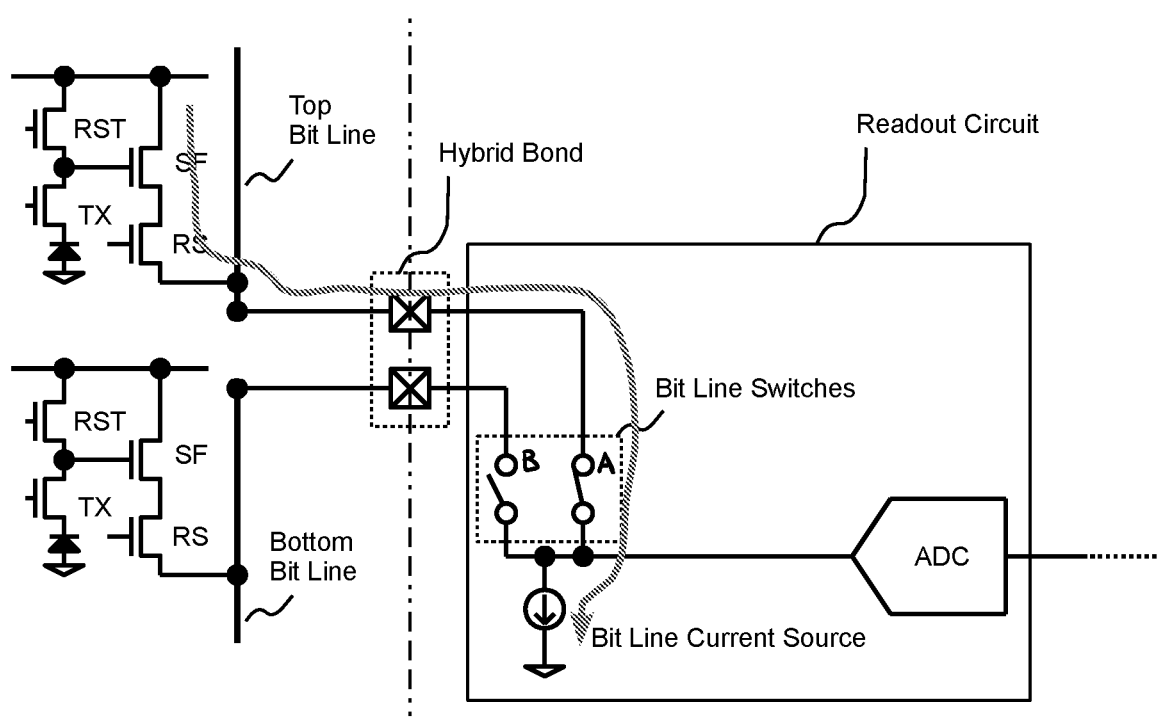
FIG. 3 is a diagram illustrating one example of a readout circuit coupled to read out image data from a pixel array through divided bit lines in an imaging system.

FIG. 3 is a diagram illustrating one example of a readout circuit coupled to read out pixels through divided bit lines included in an imaging system in accordance with an embodiment of the present disclosure. As illustrated in the depicted example, the readout circuit includes switching circuitry that includes bit line switches "A" and "B" to couple to the top bit line and the bottom bit line, respectively, on the pixel wafer to a bit line current source and an analog-to-digital (ADC) in the readout circuit. As shown in the depicted example, a bit line in the pixel wafer that has been segmented or divided into a top bit line and the bottom bit line, which are coupled to a shared bit line current source and also to a shared ADC through either bit line switch "A" or bit line switch "B."

In this example, a pixel includes a photo diode (PD), a transfer gate (TX) transistor, a reset (RST) transistor, a source follower (SF) transistor and a row select (RS) transistor. However, a pixel configuration in accordance with the teachings of the present invention is not only limited to a 4T pixel as described above. It is appreciated that embodiments in accordance with the teachings of the present invention may be applied to other configurations or pixels as well. For example, a technique in accordance with the teachings of the present invention can be used for pixel in which multiple PDs and TXs share the RST, SF and RS, or 3T pixel, which doesn't include the RS transistor.

It is noted that in the example illustrated in FIG. 3, the ADC and the bit line current source are connected together. The bit line switches "A" and "B" are coupled between the pixels in the pixel array and the ADC. The arrowed line in the depicted example shows an example DC current that flows through a pixel coupled to the top bit line to the bit line current source through bit line switch "A." It is noted in the example depicted in FIG. 3 that since the bit line switch "A" is coupled between the pixel and the ADC, there is also a corresponding IR-drop generated across the bit line switch during a readout operation due to the DC current flowing through the bit line switch. Consequently, such an IR-drop voltage is added to the signal at the input of the readout ADC. This IR-Drop between the bit line and the ADC during a readout operation makes the ADC voltage measurement of the top or bottom bit line far less accurate. It can be a source of linearity error or vertical fixed pattern noise because the amount of IR-drop is a function of the signal level.

Figure 4:
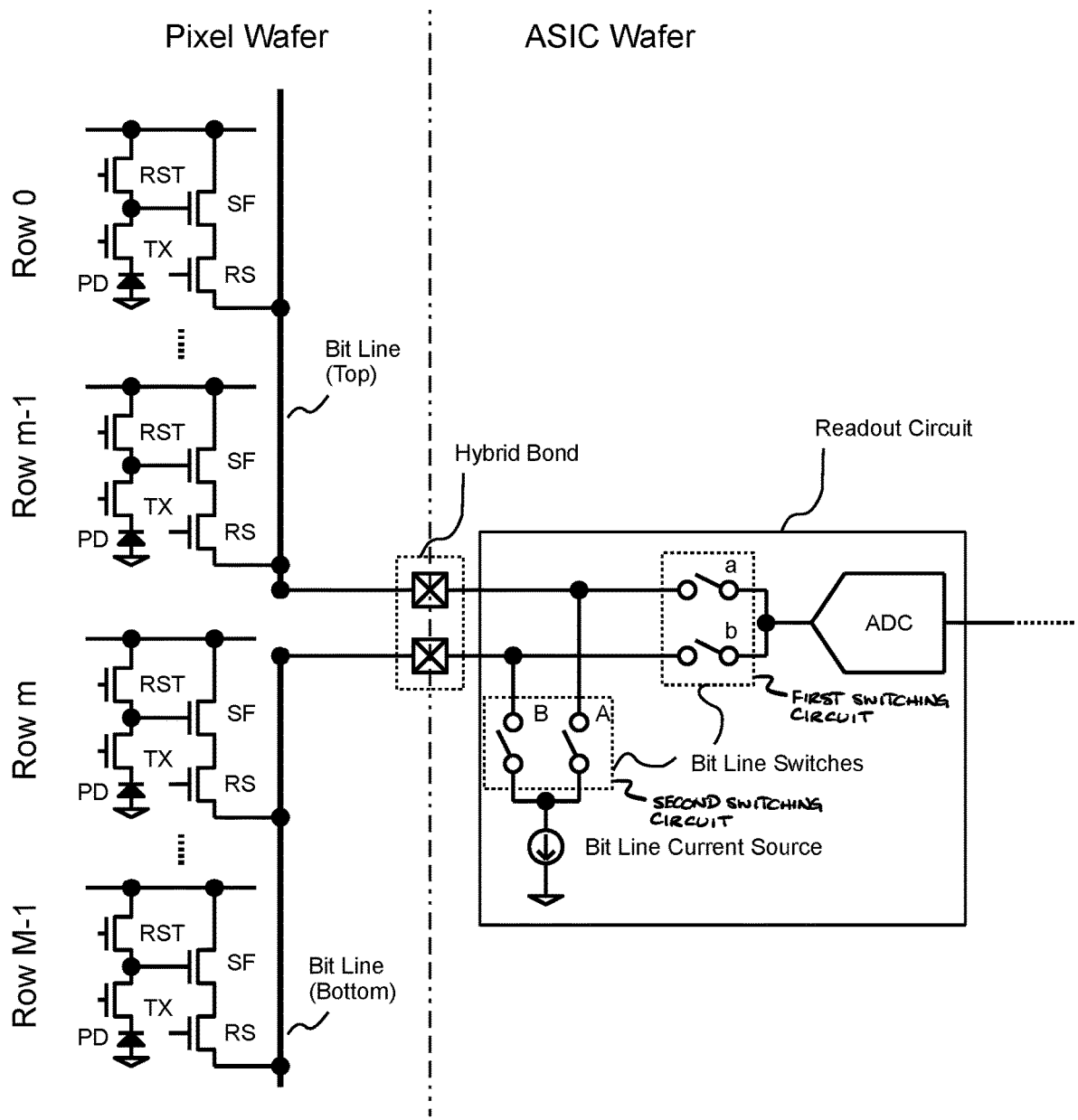
FIG. 4 is a diagram illustrating another example of a readout circuit coupled to read out image data from a pixel array through divided bit lines in an imaging system in accordance with an embodiment of the present disclosure.

FIG. 4 is a diagram of another example of a readout circuit that is coupled to read out pixels through divide bit lines included in an imaging system in accordance with an embodiment of the present disclosure. It is appreciated that the example depicted in FIG. 4 shares many similarities with the example depicted in FIG. 3. However, one difference is that the readout circuit example shown in FIG. 4 includes switching circuitry that includes a first switching circuit and a second switching circuit. In particular, the single set of bit line switches "A" and "B" included in the switching circuitry as shown in FIG. 3 has replaced with two sets of switches including first switching circuit, which includes bit line switches "a" and "b," as well as a second switching circuit, which includes bit line switches "A" and B" in accordance with the teachings of the present invention. The first switching circuit that includes bit line switches "a" or "b" of the switching circuitry couple the top bit line or the bottom bit line, respectively, to the ADC directly without going through the second switching circuit that includes the bit line switches "A" or "B", which couple the top bit line or bottom bit line to the bit line current source in accordance with the teachings of the present invention.

In operation, the second switching circuit (e.g., "A" or "B") is configured to couple the bit line current source to the bit line such that the bit line current source provides a DC current coupled to flow through the portion of the bit line that is coupled to the pixel being read out through the first switching circuit during a readout operation of the pixel that is coupled to that portion of the bit line. In addition, the other portion of the bit line that is not coupled to a pixel being read out is decoupled or disconnected from the bit line current source by the first switching circuit. The first switching circuit (e.g., "a" or "b") is configured to couple the ADC to the portion of the bit line that is coupled to the pixel being read out during the readout operation of the pixel coupled to that portion the bit line. In addition, the other portion of the bit line that is not coupled to a pixel being read out is decoupled or disconnected from the ADC by the first switching circuit. This separation of the first switching circuit including bit line switches "a" and "b" and second switching circuit including bit line switches "A" or "B" of the switching circuitry in FIG. 4 results in substantially none of the DC current provided by the bit line current source flowing through the second switching circuit during the readout operation of the pixel coupled to the portion of the bit line that is being read out, which avoids a large IR-drop being sensed at the input of ADC during a readout operation as suffered in the example depicted in FIG. 3. As such, there is no DC current flowing through any bit line switches of the switching circuitry of FIG. 4 that are coupled between the pixel and the ADC, which results in better image quality being achieved in accordance with the teachings of the present invention.

Figure 5:
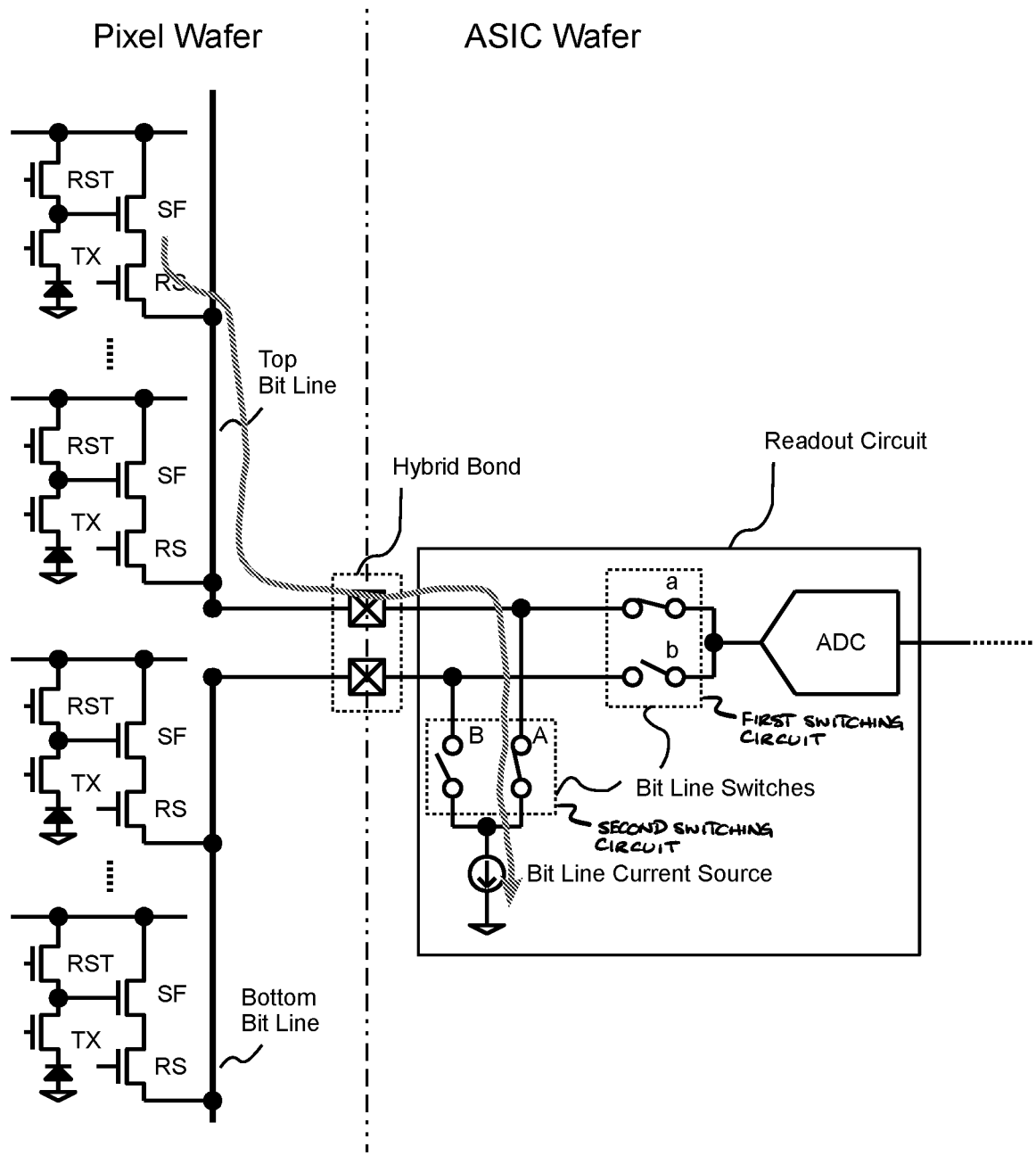
FIG. 5 is a diagram illustrating an example of a readout circuit coupled to read out pixels through a top bit line included in an imaging system in accordance with an embodiment of the present disclosure.

To illustrate, FIG. 5 is a diagram illustrating an example of a readout circuit coupled to read out pixels through a top bit line included in an imaging system in accordance with an embodiment of the present disclosure. It is appreciated that the pixel circuits and readout circuits illustrated in FIG. 5 are examples of the pixel circuits and readout circuit illustrated in FIG. 4. In the example illustrated in FIG. 5, the top pixel coupled to the top bit line is being read out as indicted with the arrowed line. In the depicted example, the row select RS transistor of the top pixel is turned on as well as bit line switch "a" of the first switching circuit and bit line switch "A" of the second switching circuit of the switching circuitry. In addition, the bit line switch "b" of the first switching circuit, as well as bit line switch "B" of the second switching circuit of the switching circuitry are both turned off. As such, the DC current flows as indicated with the arrowed line through the top pixel coupled to the top bit line, through bit line switch "A," and through the bit line current source. However, substantially no DC current flows through bit line switch "a" to the input of the ADC. As such, there is substantially no IR-drop across bit line switch "a" and better image quality is therefore achieved compared to the example depicted in FIG. 3 in accordance with the teachings of the present invention.

Figure 6:
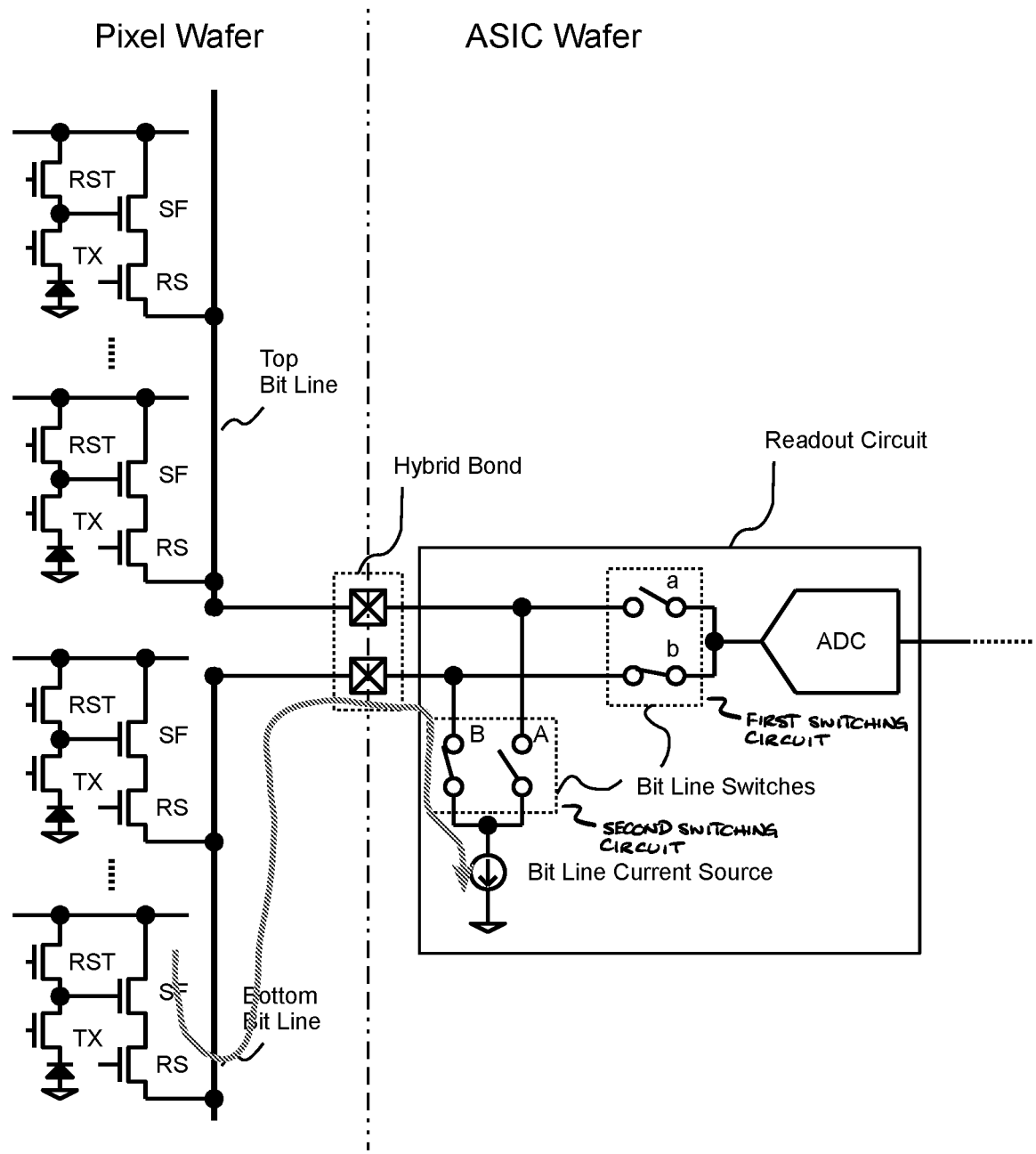
FIG. 6 is a diagram illustrating an example of a readout circuit coupled to read out pixels through a bottom bit line included in an imaging system in accordance with an embodiment of the present disclosure.

Similarly, FIG. 6 is a diagram illustrating an example of a readout circuit coupled to read out pixels through a bottom bit line included in an imaging system in accordance with an embodiment of the present disclosure. It is appreciated that the pixel circuits and readout circuits illustrated in FIG. 6 are examples of the pixel circuits and readout circuit illustrated in FIGS. 4 and 5. However, in the example illustrated in FIG. 6, the bottom pixel coupled to the bottom bit line is being read out as indicted with the arrowed line. In the depicted example, the row select RS transistor of the bottom pixel is turned on as well as bit line switch "b" of the first switching circuit and bit line switch "B" of the second switching circuit of the switching circuitry. In addition, the bit line switch "a" of the first switching circuit, as well as bit line switch "A" of the second switching circuit of the switching circuitry are both turned off. As such, the DC current flows as indicated with the arrowed line through the bottom pixel coupled to the bottom bit line, through bit line switch "B," and through the bit line current source. However, substantially no DC current flows through bit line switch "b" to the input of the ADC during a readout operation. As such, there is substantially no IR-drop across bit line switch "b" during a readout operation and better image quality is therefore achieved compared to the example depicted in FIG. 3 in accordance with the teachings of the present invention.

Figure 7:
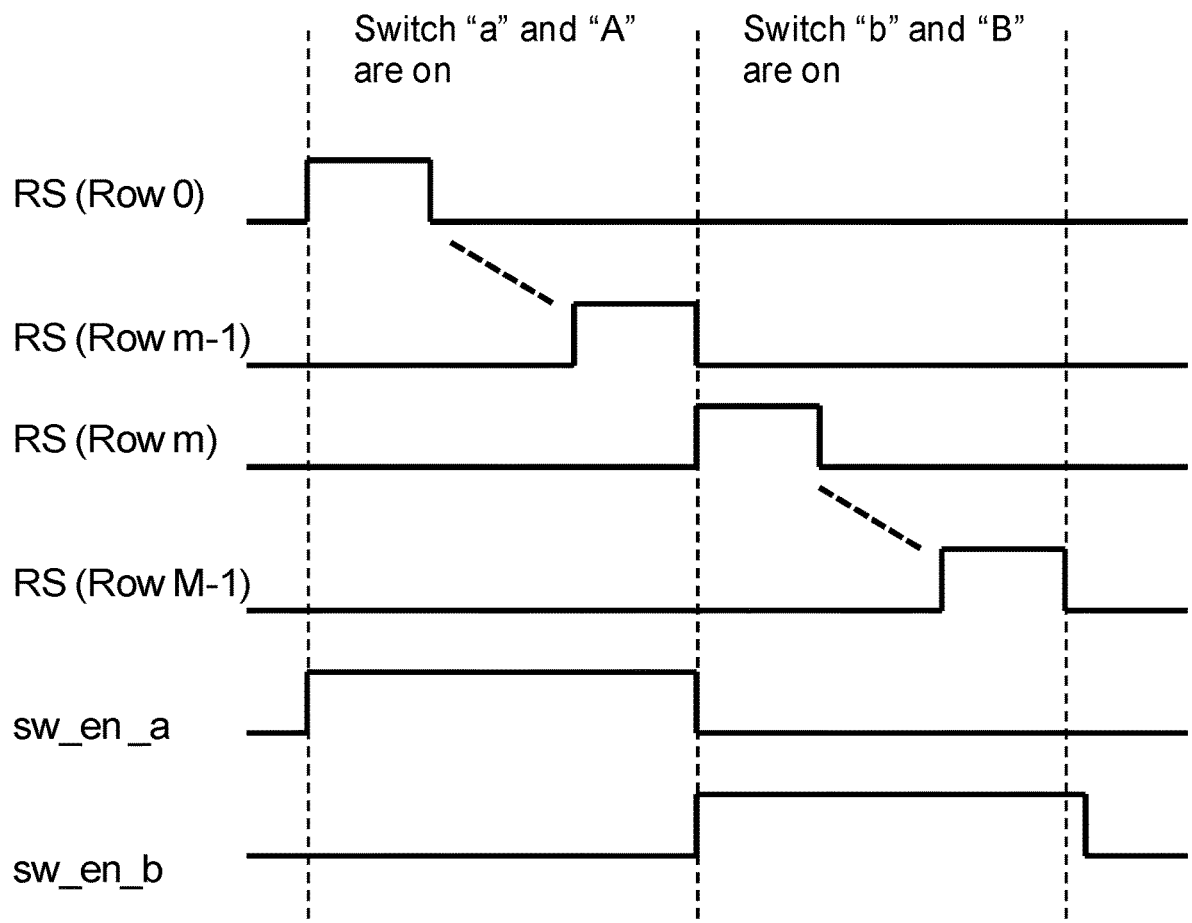
FIG. 7 is a timing diagram illustrating example waveforms of pixels and a readout circuit in accordance with an embodiment of the present disclosure.

In operation, FIG. 7 is a timing diagram illustrating example waveforms of pixels and a readout circuit in accordance with an embodiment of the present disclosure. It is noted that the pixel and readout circuit waveforms depicted in FIG. 7 may be examples of waveforms of the pixel and readout circuits illustrated in the examples of FIGS. 4-6 discussed above. For instance, when one of the shared pixels coupled to the top bit line is selected, as shown for example in FIG. 5 with the row select RS signal being activated for the pixel being read out, a signal sw_en_a as shown in FIG. 7 is set to high so that bit line switch "a" of the first switching circuit and bit line switch "A" of the second switching circuit of the switching circuitry are turned on. In other words, the first switching circuit and the second switching circuit are coupled to be responsive to a row select signal RS of the pixel that is coupled to the bit line that is being read out. However, when one of the shared pixels coupled to the bottom bit line is selected, as shown for example in FIG. 6, a signal sw_en_b as shown in FIG. 7 is set to high so that bit line switch "b" of the first switching circuit and bit line switch "B" of the second switching circuit of the switching circuitry are turned on.

Figure 8:
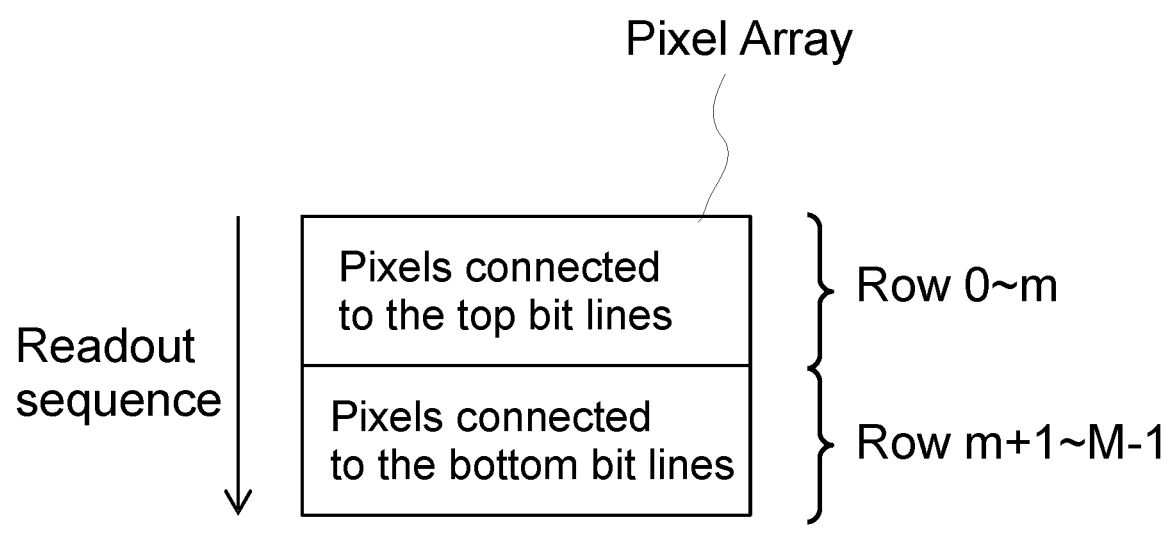
FIG. 8 is a diagram illustrating the readout sequence of an example pixel array in accordance with an embodiment of the present disclosure.

FIG. 8 is a diagram illustrating the readout sequence of an example pixel array in accordance with an embodiment of the present disclosure. In the depicted example, the pixel array has M rows, numbered from row 0 to row M−1. In the example, the bit lines of the pixel array are divided between bit lines in accordance with the teachings of the present invention. In the example, the bit lines are divided between row m and row m+1 such that the pixels connected to the top bit lines are the pixels of row 0 to row m, and the pixels connected to the bottom bit lines are the pixels of rows m+1 to M−1. In a sequence, signals from all pixels connected to the top bit lines (rows 0 to m−1) and bottom bit lines (rows m to M−1) can be read out continuously as shown in FIG. 8, even if the bit line is segmented or divided (near the middle) to separate the pixel array into a top and bottom sections. As a result, focal plane distortion is the same as conventional CMOS image sensors (CIS) with a rolling shutter because the top and the bottom pixel array can be scanned continuously as shown in FIG. 8, even though the bit lines are divided near the middle. As shown in FIG. 7, the bit line switches "a" and "A" or "b" and "B" of each row may be switched on with the same row select (RS) circuits of the pixels in sequence for each row 0 through M−1 of the pixel array in accordance with the teachings of the present invention.

Figure 9:
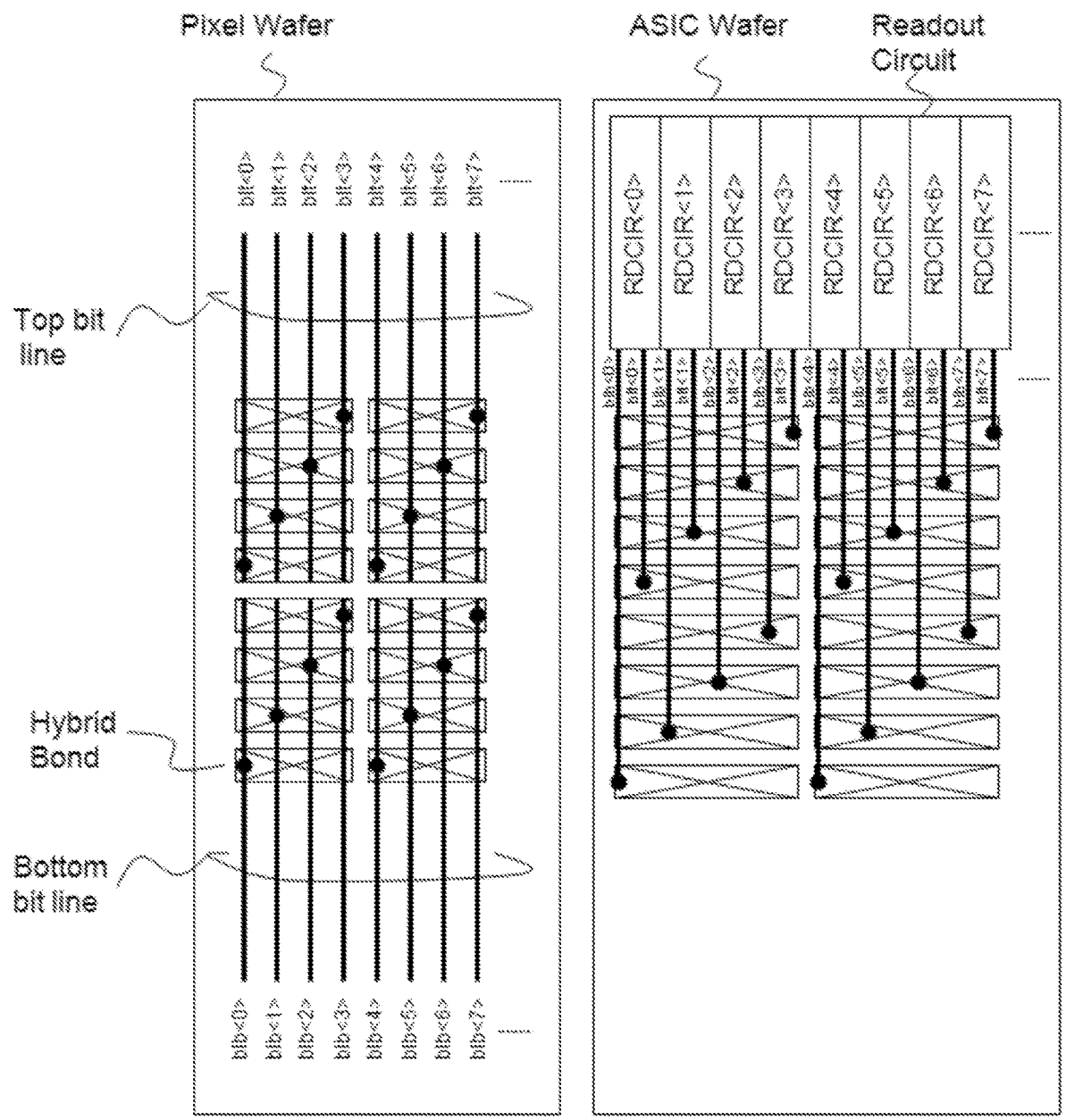
FIG. 9 is a diagram illustrating another example of divided bit lines in a pixel wafer and associated readout circuits in an ASIC in accordance with an embodiment of the present disclosure.

FIG. 9 is a diagram illustrating another example of divided bit lines in a pixel wafer and associated readout circuits in an ASIC in accordance with an embodiment of the present disclosure. The example depicted in FIG. 9 shows that it is ideal to cut or divide each bit line near its center, i.e., near the vertical center of the pixel array such that there are nearly equal portions of rows above and below the separation. In the illustrated example, all of bit lines are cut in the middle at the same vertical center location.

Figure 10:
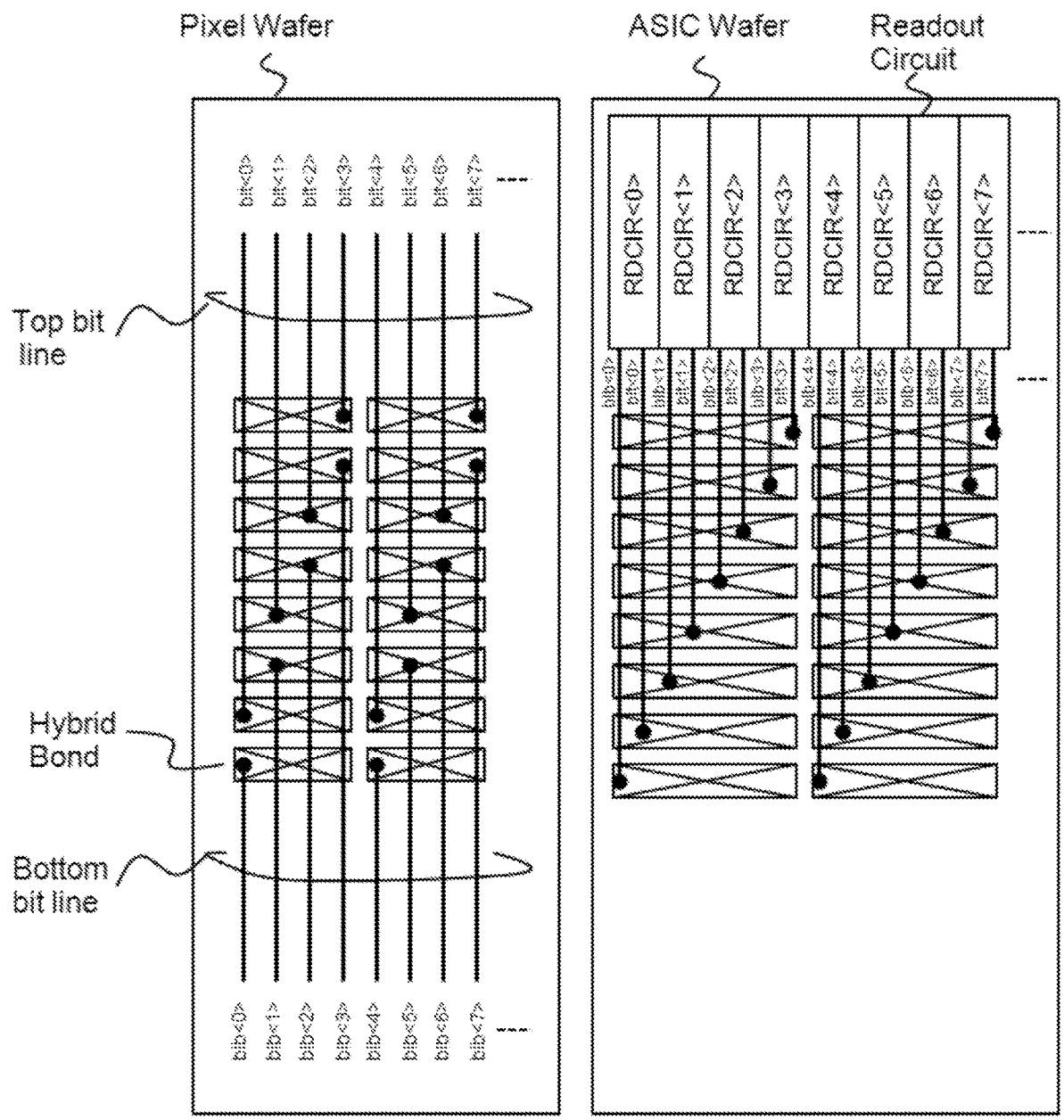
FIG. 10 is a diagram illustrating still another example of divided bit lines in a pixel wafer and associated readout circuits in an ASIC in accordance with an embodiment of the present disclosure.

However, it is appreciated that sometimes dividing each bit line near the vertical center of the pixel array may not be efficient in layout. In other words, as will be shown, the portion of rows of pixels of one column of pixels coupled to a divided bit line may be different than the portion of rows of pixels of other columns of pixels coupled to other divided bit lines in accordance with the teachings of the present invention. For example, in the example shown in FIG. 10, each bit line is cut near its vertical center, but the positions are slightly different. Bit lines are also routed on the ASIC wafer. If the parasitic capacitances on bit lines are similar between on the pixel wafer and on the ASIC wafer, the difference in total bit line capacitance in the examples shown in FIG. 9 and FIG. 10 are very small. So one can choose the cutting point depending on layout of each circuit component or chip floor plan.

For instance, if the height of a readout circuit only occupies roughly the top ⅓ of the pixel array, the bit lines can be cut at location ⅓ from the top of pixel array such that the bit lines are coupled to only ⅓ of the rows of the pixel array for that column. Even though the location is not near the vertical center of the pixel array, this is still effective in reducing bit line capacitance and increasing frame rate. In such an example, the readout circuit can be allocated within the top portion of ASIC wafer so that there is a large (about ⅔ of the rows of the pixel array) area on the bottom side of ASIC wafer where other components such as logic circuits and interface circuits that output data from the CMOS image sensor (CIS) to external integrated circuits (ICs) can be located. If the bit lines are divided at the exact center of pixel array, bit line capacitance can be cut in half so that settling time may also be reduced nearly in half. However, if the bit lines are cut at a location ⅓ of pixel array from the top, the length of bottom bit lines are reduced to ⅔ of the length compared to a bit line that has not been divided. The capacitance of the bottom bit line may therefore be reduced to ⅔ of its original value and therefore, the settling time may be reduced to ⅔ of its original value as well.

In some examples, it is appreciated that the pitch of the hybrid bond may be larger than the pitch of the bit lines. For example, if the pitch of hybrid bond is larger than three times of the bit line, the bit lines need to be cut at least at four different vertical positions in a repeated pattern as shown in FIG. 10. In an example in which the pitch of the column readout circuit and the pitch of the bit line share the same pitch, all readout circuits may be located on one side (e.g., on the top or on the bottom) of the ASIC wafer. The example depicted in FIG. 10 shows all readout circuits located on top side of the ASIC wafer.

Figure 11:
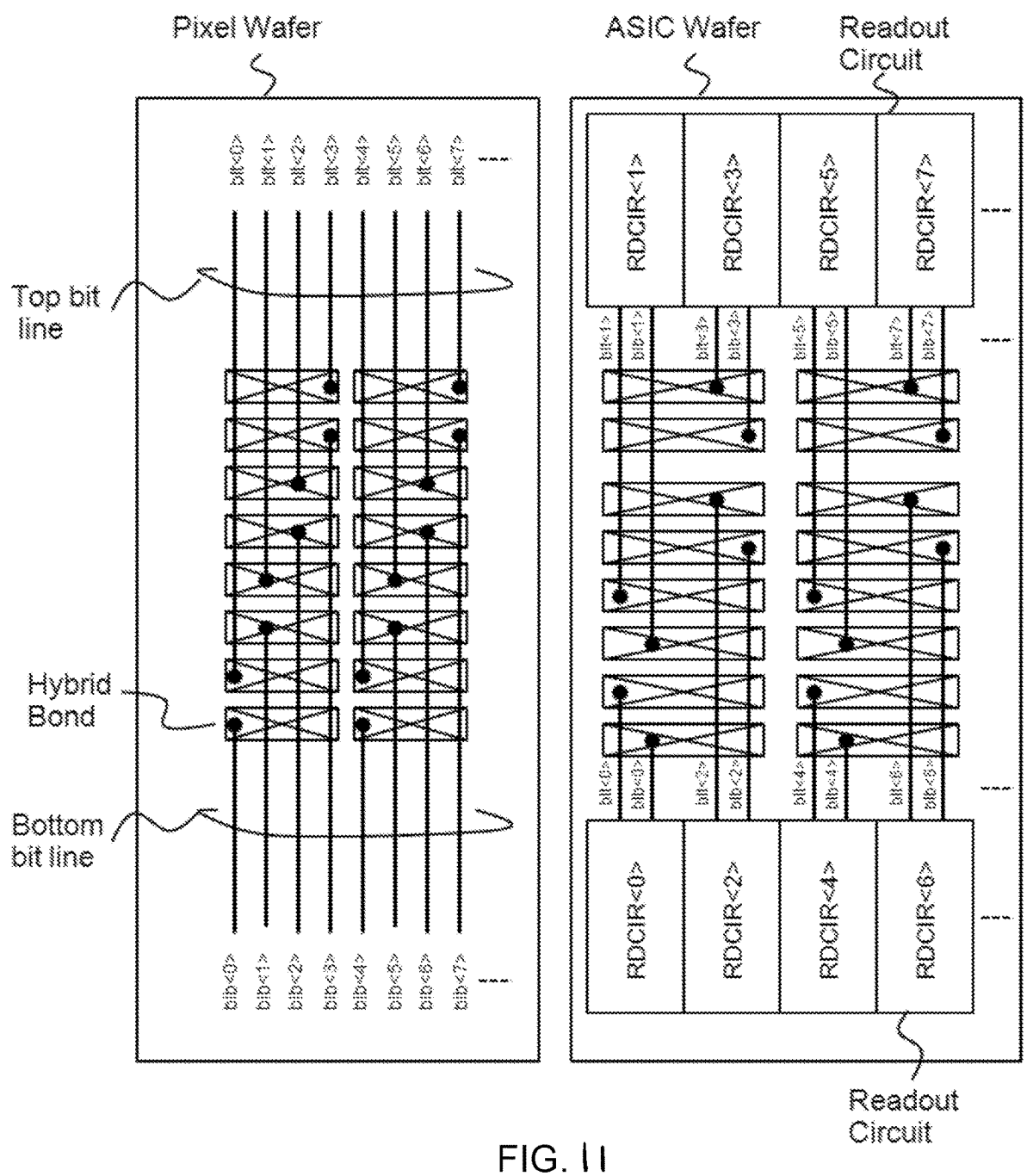
FIG. 11 is a diagram illustrating yet another example of divided bit lines in a pixel wafer and associated readout circuits in an ASIC in accordance with an embodiment of the present disclosure.

FIG. 11 is a diagram illustrating yet another example of divided bit lines in a pixel wafer and associated readout circuits in an ASIC in accordance with an embodiment of the present disclosure. In the depicted example, the pitch of the bit lines and the pitch of the readout circuits are different. If the pitch of the readout circuits is larger than the pitch of the bit lines, readout circuits may be put on both the top and bottom of hybrid bonds as shown in FIG. 11. In the illustrated example, readout circuits 0 and 1 are flipped vertically to be placed on the top and on the bottom in alternating fashion such that the readout circuits (RDCIR0, RDCIR 2, RDCIR 4, RDCIR 6, . . . ) for even bit lines (blt<0>, blb<0>, blt<2>, blb<2>, . . . ) may be placed closely to each other on the bottom portion of the ASIC wafer, and readout circuits (RDCIR 1, RDCIR 3, RDCIR 5, RDCIR 7, . . . ) for odd bit lines (blt<1>, blb<1>, blt<3>, blb<3>, . . . ) may be placed closely to each other on the top portion of the ASIC wafer. In this example, both even and odd bit lines may be cut near the middle or vertical center of the pixel array of the pixel wafer. The capacitance of each even and odd bit line may be reduced most effectively regardless the height of readout circuit.

Figure 12:
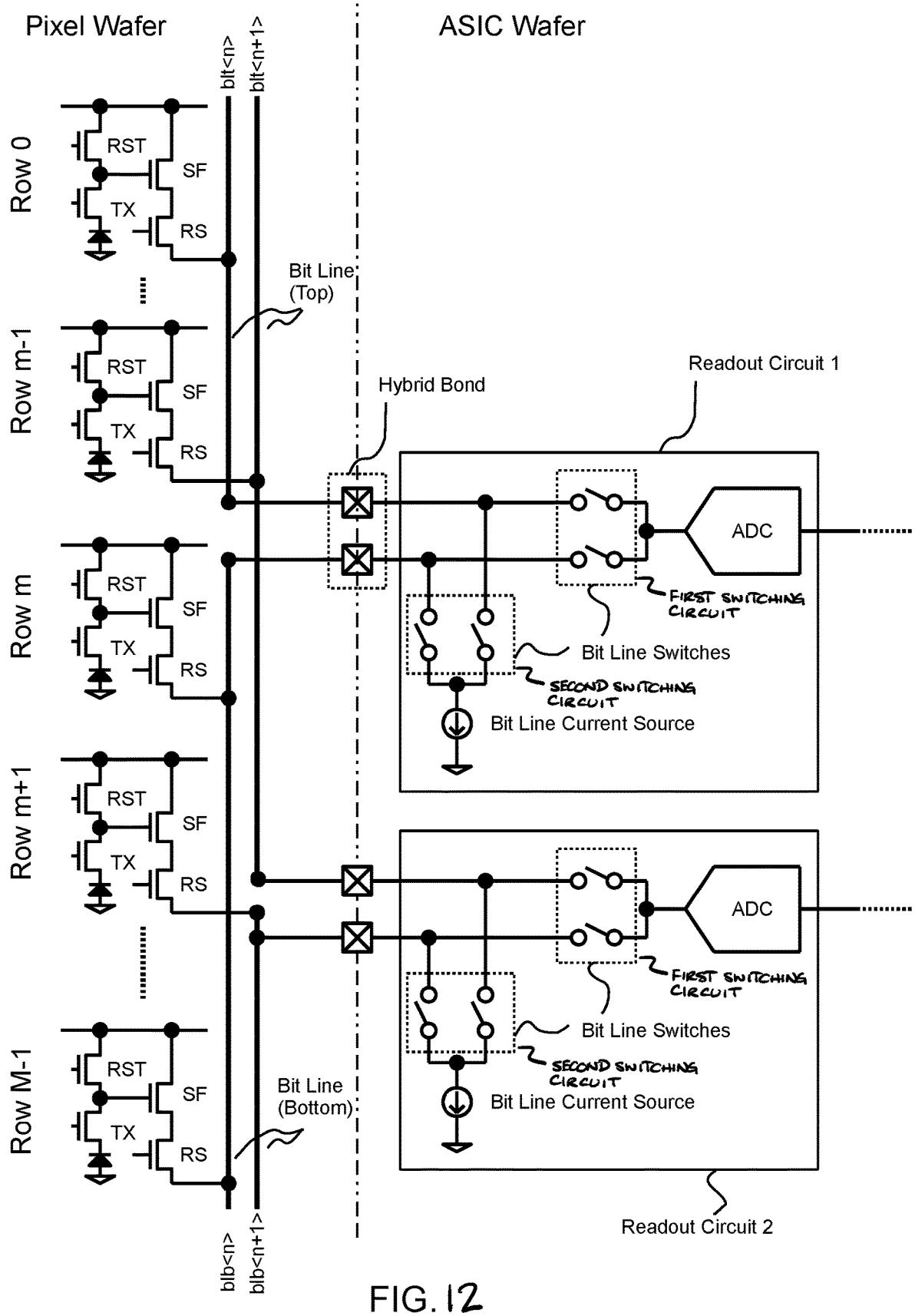
FIG. 12 is a diagram an example of readout circuits coupled to read out pixels included in an example imaging system as shown in FIG. 10 in accordance with an embodiment of the present disclosure.

FIG. 12 is a diagram an example of readout circuits coupled to read out pixels included in an example imaging system as shown in FIG. 11 in accordance with an embodiment of the present disclosure. It is appreciated that the readout circuit illustrated in FIG. 12 shares many similarities with the readout circuits illustrated in FIGS. 4-6 above. However, in the example illustrated in FIG. 12, the pixels included in even rows (e.g., Row 0, . . . , Row m, . . . ) are coupled to even bit lines (e.g., blt<0>, blt<m>, . . . ) and pixels included in odd rows (e.g., Row 1, . . . , Row m−1, Row m+1, . . . ) are coupled to the odd bit lines (blt<1>, blt<n+1>, . . . ). Readout circuit 1 is coupled to read out the rows coupled to the even bit line and readout circuit 2 is coupled to read out the rows coupled to the odd bit line.

Figure 13:
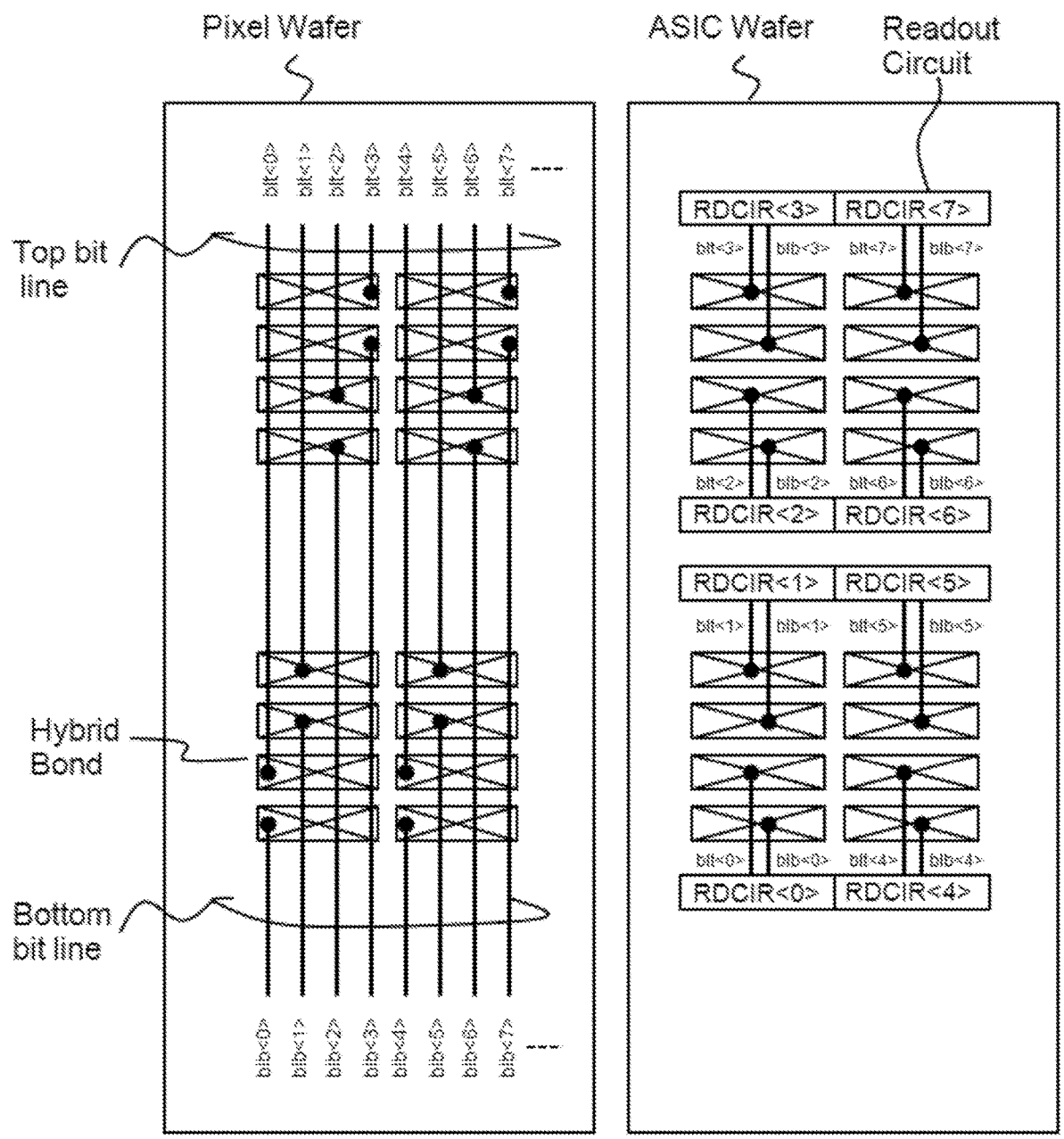
FIG. 13 is a diagram illustrating yet another example of divided bit lines in a pixel wafer and associated readout circuits in an ASIC in accordance with an embodiment of the present disclosure.

FIG. 13 is a diagram illustrating yet another example of divided bit lines in a pixel wafer and associated readout circuits in an ASIC in accordance with an embodiment of the present disclosure. In particular, it is appreciated that more readout circuits can be stacked in the same way. For instance, FIG. 13 shows an example in which the pitch of the bit lines are ¼ of hybrid bonds and readout circuits. In the depicted example, four readout circuits (e.g., RDCIR<0>, RDCIR<1>, RDCIR<2> and RDCIR<3>) are stacked. If the height of each readout circuit and ADC occupies ¼ section of the vertical pixel array, the remaining bottom section of the longest bit line can be ¾ of the original full height (4/4) so that bit line settling time can be reduced to ¾ (from the original 4/4). Bit line, hybrid bond, and readout circuit arrangement may be optimized depending on pitch, sensor size and block size to minimize the length of longest bit lines as described throughout in accordance with the teachings of the present invention.

Figure 14:
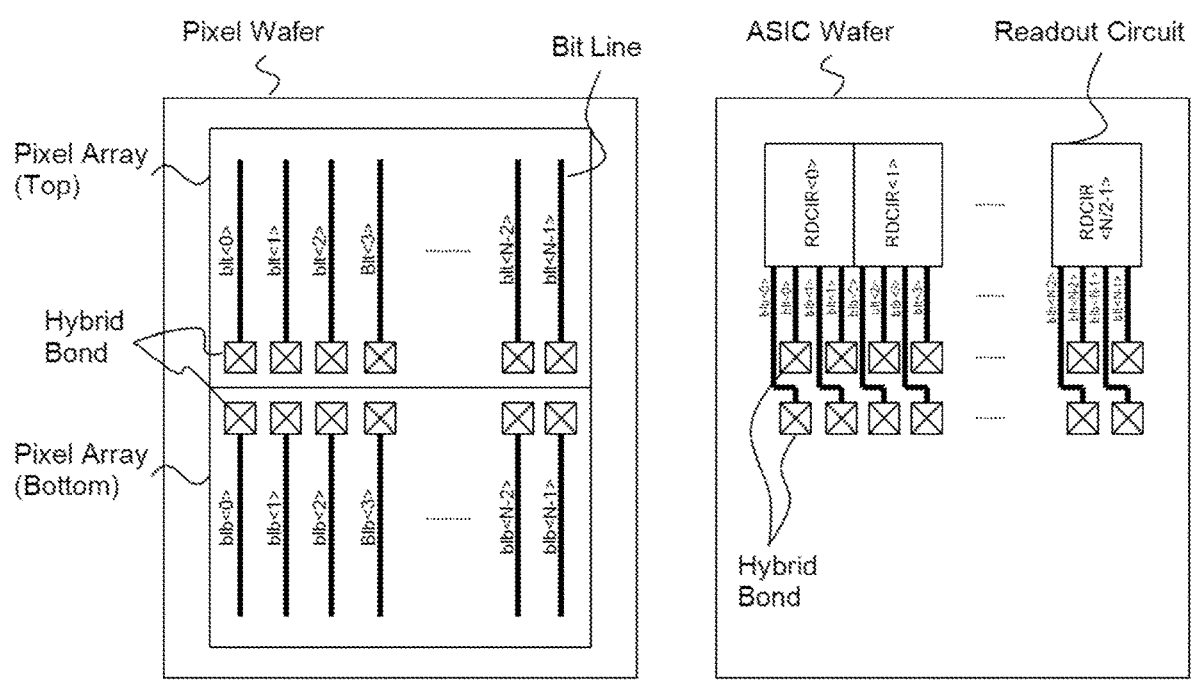
FIG. 14 is a diagram illustrating still another example of divided bit lines in a pixel wafer and associated readout circuits in an ASIC in accordance with an embodiment of the present disclosure.

FIG. 14 is a diagram illustrating still another example of divided bit lines in a pixel wafer and associated readout circuits in an ASIC in accordance with an embodiment of the present disclosure. In the example, each readout circuit can be shared by multiple bit lines. In particular, FIG. 14 shows an example in which the pitch of bit lines and hybrid bonds are half of the pitch of the readout circuit. In this example, four bit lines (e.g., blt<0>, blb<0>, blt<1> and blb<1>) are connected to the same readout circuit (e.g., RDCIR<0>).

Figure 15:
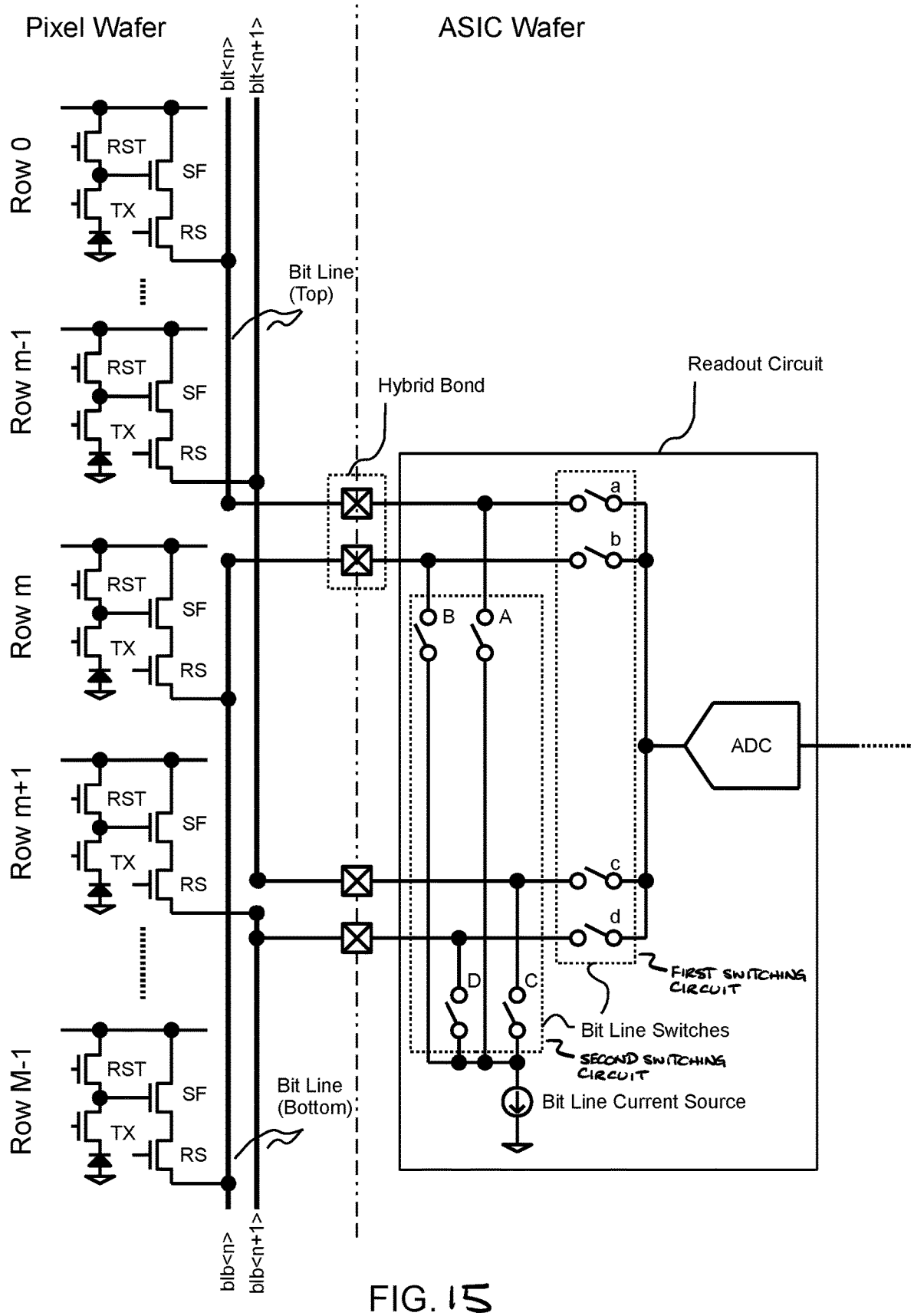
FIG. 15 is a diagram an example of readout circuits coupled to read out pixels included in an example imaging system as shown in FIG. 14 in accordance with an embodiment of the present disclosure.

FIG. 15 is a diagram an example of readout circuits coupled to read out pixels included in an example imaging system as shown in FIG. 14 in accordance with an embodiment of the present disclosure. It is appreciated that the readout circuit illustrated in FIG. 15 shares many similarities with the readout circuits illustrated in FIGS. 4-6 above. However, in the example illustrated in FIG. 15, pixels included in even rows (e.g., Row 0, . . . , Row m, . . . ) are coupled to even bit lines (e.g., blt<0>, blt<n>, . . . or blb<0>, blb<n>, . . . ) and pixels included in odd rows (e.g., Row 1, . . . Row m−1, Row m+1, . . . ) are coupled to the odd bit lines (e.g., blt<1>, blt<n+1>, . . . or blb<1>, blb<n+1>, . . . ). In addition, as shown in the example depicted in FIG. 15, both even and odd adjacent bit lines (e.g., blt<n>, blt<n+1>, blb<n>, and blb<n+1> as shown) are coupled to the same readout circuit. As such, the switching circuitry included in the readout circuit includes a first switching circuit that includes set of bit line switches (e.g., "a" "b" "c" or "d") to couple the top or bottom of the even and odd bit lines to the ADC and a second switching circuit that includes another set of bit line switches (e.g., "A" "B" "C" or "D") to couple the top or bottom even and odd bit lines to the bit line current source during a readout operation in a manner similar to the example described above in FIGS. 4-6. As such, in order to read out a signal from the top or bottom bit lines, the appropriate bit line switches "a/A" "b/B" "c/C" or "d/D" are turned on. For instance, bit line switch "a" and bit line switch "A" are turned on to read out signal from bit line blt<n> or bit line switch "b" and bit line switch "B" are turned on when a signal is read out from bit line blb<n>. A signal can be readout from bit line blt<n+1> or bit line blb<n+1> in similar way by turning on bit line switch "c" and bit line switch "C", or bit line switch "d" and bit line switch "D", respectively, in accordance with the teachings of the present invention. In addition, substantially no DC current flows through any of the bit line switches in the first switching circuit (e.g., "a" "b" "c" or "d") to the input of the ADC during a readout operation. As such, there is substantially no IR-drop across any of the bit line switches in the first switching circuit and better image quality is therefore achieved in accordance with the teachings of the present invention.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
  a pixel array including a plurality of pixels, wherein each pixel is coupled to generate image data in response to incident light;
  a bit line coupled to a column of pixels of the pixel array, wherein the bit line is separated in to a plurality of portions, wherein each one of the plurality of portions of the bit line is coupled to a corresponding portion of rows of pixels of the pixel array, wherein the portions of the bit line are electrically isolated from one another; and
  a readout circuit including:
    a first switching circuit coupled to the bit line;
    a bit line current source coupled to the first switching circuit, wherein the first switching circuit is configured to couple the bit line current source to the bit line such that the bit line current source provides a DC current coupled to flow through the bit line and through the first switching circuit during a readout operation of a pixel coupled to the bit line;
    a second switching circuit coupled to the bit line; and
    an analog-to-digital converter (ADC) coupled to the second switching circuit, wherein the second switching circuit is configured to couple the ADC to the bit line during the readout operation of the pixel coupled to the bit line, wherein substantially none of the DC current provided by the bit line current source flows through the second switching circuit during the readout operation of the pixel coupled to the bit line.

2. The image sensor of claim 1, wherein the portions of the bit line include a first portion and a second portion, wherein the pixel coupled to the bit line is a first pixel coupled to the first portion of the bit line, wherein the first switching circuit is further configured to decouple the bit line current source from the second portion of the bit line, and wherein the second switching circuit is further configured to decouple the second portion of the bit line from the ADC during the readout operation of the pixel coupled to the bit line.

3. The image sensor of claim 2, wherein the bit line is a first bit line of a plurality of bit lines, wherein the column of pixels is a first column of pixels of a plurality of columns of the pixel array, and wherein the readout circuit is first readout circuit of a plurality of readout circuits, wherein the image sensor further comprises:
  a second bit line of the plurality of bit lines, wherein the second bit line is coupled to a second column of pixels of the pixel array, wherein the second bit line is separated in to a plurality of portions, wherein each one of the plurality of portions of the second bit line is coupled to a corresponding portion of rows of pixels of the pixel array, wherein the portions of the second bit line are electrically isolated from one another; and
  a second readout circuit including:
    a first switching circuit of the second readout circuit coupled to the second bit line;
    a bit line current source of the second readout circuit coupled to the first switching circuit of the second readout circuit, wherein the first switching circuit of the second readout circuit is configured to couple the bit line current source of the second readout circuit to the second bit line such that the bit line current source of the second readout circuit provides a second DC current coupled to flow through the second bit line and through the first switching circuit of the second readout circuit during a readout operation of a second pixel coupled to the second bit line;
    a second switching circuit of the second readout circuit coupled to the second bit line; and
    an analog-to-digital converter (ADC) of the second readout circuit coupled to the second switching circuit of the second readout circuit, wherein the second switching circuit of the second readout circuit is configured to couple the ADC of the second readout circuit to the second bit line during the readout operation of the second pixel coupled to the second bit line, wherein substantially none of the second DC current provided by the bit line current source of the second readout circuit flows through the second switching circuit of the second readout circuit during the readout operation of the second pixel coupled to the second bit line.

4. The image sensor of claim 3, wherein the portions of the second bit line include a first portion and a second portion, wherein the second pixel coupled to the second bit line is a second pixel coupled to the first portion of the second bit line, wherein the first switching circuit of the second readout circuit is further configured to decouple the bit line current source of the second readout circuit from the second portion of the second bit line, and wherein the second switching circuit of the second readout circuit is further configured to decouple the second portion of the second bit line from the ADC of the second readout circuit during the readout operation of the second pixel coupled to the second bit line.

5. The image sensor of claim 4, wherein the first portion of rows of pixels from the first column of pixels coupled to the first pixel is different than the first portion of rows of pixels from the second column of pixels coupled to the second pixel, and wherein the second portion of rows of pixels from the first column of pixels is different than the second portion of rows of pixels from the second column of pixels.

6. The image sensor of claim 2, wherein the bit line is a first bit line of a plurality of bit lines, wherein the column of pixels is a first column of pixels of a plurality of columns of the pixel array, wherein the image sensor further comprises:
a second bit line of the plurality of bit lines, wherein the second bit line is coupled to a second column of pixels of the pixel array, wherein the second bit line is separated in to a plurality of portions, wherein each one of the plurality of portions of the second bit line is coupled to a corresponding portion of rows of pixels of the pixel array, wherein the portions of the second bit line are electrically isolated from one another,
wherein the first switching circuit is further configured to couple the bit line current source to the second bit line such that the bit line current source provides the DC current coupled to flow through the second bit line and through the first switching circuit during a readout operation of a second pixel coupled to the second bit line, and
wherein the second switching circuit is further configured to couple the ADC to the second bit line during the readout operation of the second pixel coupled to the second bit line, wherein substantially none of the DC current provided by the bit line current source flows through the second switching circuit during the readout operation of the second pixel coupled to the second bit line.

7. The image sensor of claim 6, wherein the portions of the second bit line include a first portion and a second portion, wherein the second pixel coupled to the second bit line is a second pixel coupled to the first portion of the second bit line, wherein the first switching circuit of the is further configured to decouple the bit line current source from the second portion of the second bit line, and wherein the second switching circuit is further configured to decouple the second portion of the second bit line from the ADC during the readout operation of the second pixel coupled to the second bit line.

8. The image sensor of claim 7, wherein the first portion of rows of pixels from the first column of pixels coupled to the first pixel is different than the first portion of rows of pixels from the second column of pixels coupled to the second pixel, and wherein the second portion of rows of pixels from the first column of pixels is different than the second portion of rows of pixels from the second column of pixels.

9. The image sensor of claim 1, wherein the pixel array and the bit line are disposed in a first wafer and wherein the readout circuit is disposed in a second wafer.

10. The image sensor of claim 1, wherein the first switching circuit and the second switching circuit are coupled to be responsive to a row select signal of the pixel that is coupled to the bit line that is being read out.

11. An imaging system, comprising:
a pixel array including a plurality of pixels to generate image data in response to incident light and organized into a plurality of rows and a plurality of columns;
control circuitry coupled to the pixel array to control operation of the pixel array;
a plurality of bit lines coupled to the pixel array, wherein each bit line is coupled to a corresponding column of pixels of the pixel array, wherein each bit line is separated in to a plurality of portions, wherein the portions of each bit line are electrically isolated from one another, wherein the plurality of bit lines includes a first bit line coupled to a first column of pixels of the pixel array; and
a first readout circuit coupled the first bit line, wherein the first readout circuit includes:
a first switching circuit coupled to the first bit line;
a bit line current source coupled to the first switching circuit, wherein the first switching circuit is configured to couple the bit line current source to the first bit line such that the bit line current source provides a DC current coupled to flow through the first bit line and through the first switching circuit during a readout operation of a pixel coupled to the first bit line;
a second switching circuit coupled to the first bit line; and
an analog-to-digital converter (ADC) coupled to the second switching circuit, wherein the second switching circuit is configured to couple the ADC to the first bit line during the readout operation of the pixel coupled to the first bit line, wherein substantially none of the DC current provided by the bit line current source flows through the second switching circuit during the readout operation of the pixel coupled to the first bit line.

12. The imaging system of claim 11, further comprising function logic coupled to the first readout circuit to storage image data read out from the pixel array.

13. The imaging system of claim 11, wherein the pixel array and the first bit line are disposed in a first wafer and wherein the first readout circuit is disposed in a second wafer.

14. The imaging system of claim 11, wherein the portions of the first bit line include a first portion and a second portion, wherein the pixel coupled to the first bit line is a first pixel coupled to the first portion of the first bit line, wherein the first switching circuit is further configured to decouple the bit line current source from the second portion of the first bit line, and wherein the second switching circuit is further configured to decouple the second portion of the first bit line from the ADC during the readout operation of the first pixel coupled to the first bit line.

15. The imaging system of claim 14, further comprising:
a second bit line of the plurality of bit lines, wherein the second bit line is coupled to a second column of pixels of the pixel array, wherein the second bit line is separated in to a plurality of portions, wherein each one of the plurality of portions of the second bit line is coupled to a corresponding portion of rows of pixels of the pixel array, wherein the portions of the second bit line are electrically isolated from one another; and
a second readout circuit including:
a first switching circuit of the second readout circuit coupled to the second bit line;
a bit line current source of the second readout circuit coupled to the first switching circuit of the second readout circuit, wherein the first switching circuit of the second readout circuit is configured to couple the bit line current source of the second readout circuit to the second bit line such that the bit line current source of the second readout circuit provides a second DC current coupled to flow through the second bit line and through the first switching circuit of the second readout circuit during a readout operation of a second pixel coupled to the second bit line;

a second switching circuit of the second readout circuit coupled to the second bit line; and an analog-to-digital converter (ADC) of the second readout circuit coupled to the second switching circuit of the second readout circuit, wherein the second switching circuit of the second readout circuit is configured to couple the ADC of the second readout circuit to the second bit line during the readout operation of the second pixel coupled to the second bit line, wherein substantially none of the second DC current provided by the bit line current source of the second readout circuit flows through the second switching circuit of the second readout circuit during the readout operation of the second pixel coupled to the second bit line.

16. The imaging system of claim 15, wherein the portions of the second bit line include a first portion and a second portion, wherein the second pixel coupled to the second bit line is a second pixel coupled to the first portion of the second bit line, wherein the first switching circuit of the second readout circuit is further configured to decouple the bit line current source of the second readout circuit from the second portion of the second bit line, and wherein the second switching circuit of the second readout circuit is further configured to decouple the second portion of the second bit line from the ADC of the second readout circuit during the readout operation of the second pixel coupled to the second bit line.

17. The imaging system of claim 16, wherein the first portion of rows of pixels from the first column of pixels coupled to the first pixel is different than the first portion of rows of pixels from the second column of pixels coupled to the second pixel, and wherein the second portion of rows of pixels from the first column of pixels is different than the second portion of rows of pixels from the second column of pixels.

18. The imaging system of claim 14,
wherein the plurality of bit lines further includes a second bit line coupled to a second column of pixels of the pixel array, wherein the second bit line is separated in to a plurality of portions, wherein each one of the plurality of portions of the second bit line is coupled to a corresponding portion of rows of pixels of the pixel array, wherein the portions of the second bit line are electrically isolated from one another, wherein the first switching circuit is further configured to couple the bit line current source to the second bit line such that the bit line current source provides the DC current coupled to flow through the second bit line and through the first switching circuit during a readout operation of a second pixel coupled to the second bit line, and wherein the second switching circuit is further configured to couple the ADC to the second bit line during the readout operation of the second pixel coupled to the second bit line, wherein substantially none of the DC current provided by the bit line current source flows through the second switching circuit during the readout operation of the second pixel coupled to the second bit line.

19. The imaging system of claim 18, wherein the portions of the second bit line include a first portion and a second portion, wherein the second pixel coupled to the second bit line is a second pixel coupled to the first portion of the second bit line, wherein the first switching circuit of the is further configured to decouple the bit line current source from the second portion of the second bit line, and wherein the second switching circuit is further configured to decouple the second portion of the second bit line from the ADC during the readout operation of the second pixel coupled to the second bit line.

20. The imaging system of claim 19, wherein the first portion of rows of pixels from the first column of pixels coupled to the first pixel is different than the first portion of rows of pixels from the second column of pixels coupled to the second pixel, and wherein the second portion of rows of pixels from the first column of pixels is different than the second portion of rows of pixels from the second column of pixels.

21. The imaging system of claim 11, wherein the first switching circuit and the second switching circuit are coupled to be responsive to a row select signal of the pixel that is coupled to the first bit line that is being read out.

* * * * *

UNITED STATES PATENT AND TRADEMARK OFFICE
CERTIFICATE OF CORRECTION

PATENT NO. : 10,750,111 B2
APPLICATION NO. : 16/222832
DATED : August 18, 2020
INVENTOR(S) : H. Ebihara et al.

It is certified that error appears in the above-identified patent and that said Letters Patent is hereby corrected as shown below:

In the Claims

| Column | Line | |
|---|---|---|
| 9 | 47 | change "in to" to -- into -- |
| 10 | 18 | change "is first" to -- is a first -- |
| 10 | 24 | change "in to" to -- into -- |
| 11 | 20 | change "in to" to -- into -- |
| 11 | 45 | change "circuit of the is" to -- circuit is -- |
| 12 | 10 | change "in to" to -- into -- |
| 12 | 14 | change "coupled the" to -- coupled to the -- |
| 12 | 57 | change "in to" to -- into -- |
| 14 | 1-2 | change "in to" to -- into -- |
| 14 | 27 | change "circuit of the is" to -- circuit is -- |

Signed and Sealed this
Eleventh Day of July, 2023

Katherine Kelly Vidal
*Director of the United States Patent and Trademark Office*